(12) United States Patent
Yin et al.

(10) Patent No.: US 10,009,605 B1
(45) Date of Patent: *Jun. 26, 2018

(54) MULTI-CAMERA FILTER SYSTEM FOR CHARACTERIZING DISPLAY PANELS

(71) Applicant: Oculus VR, LLC, Menlo Park, CA (US)

(72) Inventors: Ye Yin, Pleasanton, CA (US); Simon Hallam, San Jose, CA (US); Evan M. Richards, Santa Clara, CA (US); Shizhe Shen, San Mateo, CA (US)

(73) Assignee: Oculus VR, LLC, Menlo Park, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/420,064

(22) Filed: Jan. 30, 2017

(51) Int. Cl.
| | |
|---|---|
| *H04N 17/02* | (2006.01) |
| *H04N 9/04* | (2006.01) |
| *H04N 9/097* | (2006.01) |
| *H04N 9/12* | (2006.01) |
| *H04N 9/77* | (2006.01) |
| *H04N 5/372* | (2011.01) |
| *H01L 27/146* | (2006.01) |

(52) U.S. Cl.
CPC ....... *H04N 17/02* (2013.01); *H01L 27/14621* (2013.01); *H01L 27/14627* (2013.01); *H04N 5/372* (2013.01); *H04N 9/045* (2013.01); *H04N 9/097* (2013.01); *H04N 9/12* (2013.01); *H04N 9/77* (2013.01)

(58) Field of Classification Search
CPC .......... G01J 3/51; G01J 3/462; H04N 5/2256; H04N 5/23245
USPC ........................................................ 356/405
See application file for complete search history.

(56) References Cited

U.S. PATENT DOCUMENTS

| | | | |
|---|---|---|---|
| 9,420,242 B2 * | 8/2016 | Maruyama | ........... H04N 5/2353 |
| 9,460,516 B2 * | 10/2016 | Wu | ........................ H04N 9/27 |
| 2014/0375994 A1 * | 12/2014 | Yamanaka | .............. G01J 3/513 |
| | | | 356/402 |

* cited by examiner

*Primary Examiner* — Paulos M Natnael
(74) *Attorney, Agent, or Firm* — Fenwick & West LLP

(57) ABSTRACT

Embodiments relate to determining characteristics of a display panel by using capturing images through multiple filters where the multiple filters include at least two filters that collectively enable replicating of a color matching function. At least two filters of the multiple filters have transmission profiles that correspond to the same color matching function ($\overline{x}$ color matching function) in different wavelength ranges. Image capturing devices capture the display panel through respective filters. The captured images are processed to the display characteristics of pixels or regions of the display panel.

18 Claims, 6 Drawing Sheets

600

```
Generate a color correction matrix using a reference display panel
605
```

```
Turn on one or more pixels of a target display panel
610
```

```
Capture, by a first camera, a first image of the turned on one or more pixels
passed through a first filter that is configured with a transmittance profile that
matches a color matching function in a first wavelength range
620
```

```
Capture, by a second camera, a second image of the turned on one or more
pixels passed through a second filter that is configured with a transmittance
profile that matches the same color matching function, but in a second
wavelength range higher than the first wavelength range
625
```

```
For each captured image, update the captured image to take into account a
quantum efficiency of a sensor of the image capturing device
630
```

```
Determine tristimulus values of the turned on one or more pixels using at least
a brightness value of each updated image and the generated color correction
matrix
635
```

FIG. 6

MULTI-CAMERA FILTER SYSTEM FOR CHARACTERIZING DISPLAY PANELS

BACKGROUND

This disclosure generally relates to display panels, and more specifically, to characterizing pixels and/or subpixels in display panels using filters and cameras.

Electronic displays such as organic light emitting diode (OLED) or quantum dot displays include pixels, which may each include a variety of subpixels that emit different colored light (e.g., a red subpixel, a green subpixel, etc.). Electronic displays undergo characterization to ensure that each pixel (and corresponding colored subpixels) is appropriately calibrated and that the display characteristics (e.g., brightness, color accuracy) of the pixel can be accurately perceived.

Conventionally, when determining the display characteristics of a display panel, the components of the system (e.g., a sensor such as a charge-coupled device) need to be calibrated for each new display panel. Specifically, for each new display panel, the system must employ a color measurement instrument, such as a spectrometer, to generate a spectrum of light that can then be used to calibrate the sensors of the system. However, color measurement instruments, although accurate, are slow in generating the full spectrum of light. Therefore, calibrating the sensors of a system for each new display panel requires a significant investment in time, especially when characterizing numerous display panels.

SUMMARY

Embodiments relate to determining characteristics of display panels using a multi-camera filter system that reduces resources (e.g., time and computing resources) needed to calibrate components of the system. Images of a display panel are captured by image capturing devices through a respective filter. The captured images are processed to determine characteristics of the display panel.

In one embodiment, the filters include a first filter having a transmittance profile that that matches a color matching function in a first wavelength range and a second filter having a transmittance profile a transmittance profile that matches the color matching function in a second wavelength range higher than the first wavelength range. Each of two image capturing devices captures an image through either the first or second filter. By having two filters that cover different wavelength ranges, overlapping contributions from wavelengths of light can be reduced.

BRIEF DESCRIPTION OF THE DRAWINGS

FIG. 6 is a flowchart illustrating a process for determining characteristics of a target display panel, in accordance with one embodiment.

DETAILED DESCRIPTION

Figure 1:
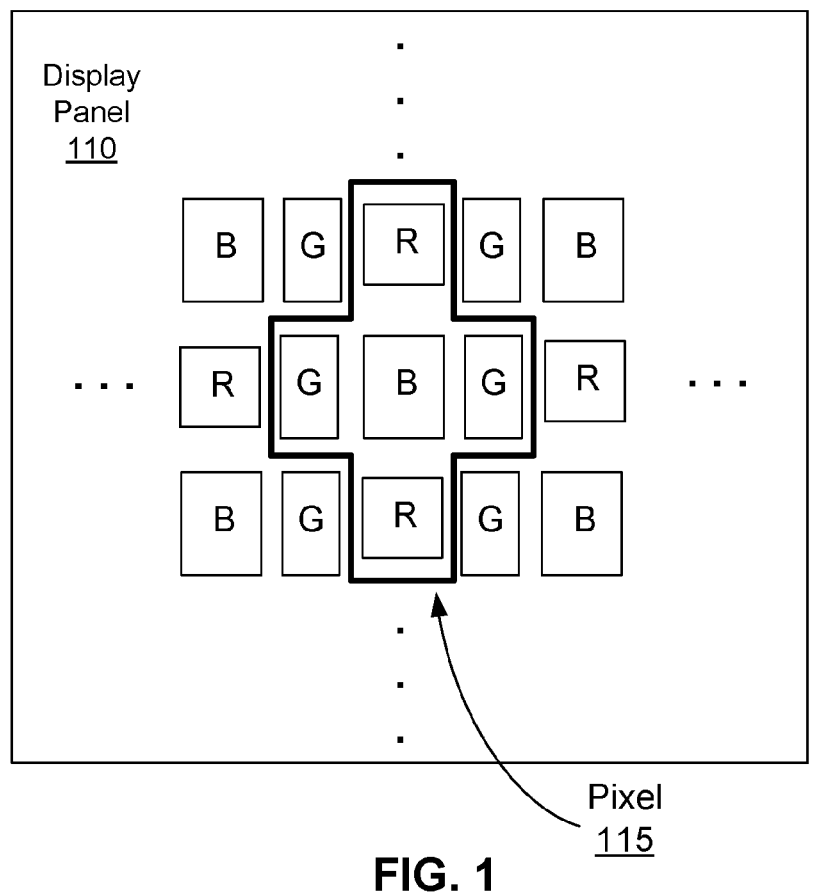
FIG. 1 is a diagram depicting an example of a pixel scheme on a display panel, in accordance with an embodiment.

The figures use like reference numerals to identify like elements. A letter after a reference numeral, such as "220A," indicates that the text refers specifically to the element having that particular reference numeral. A reference numeral in the text without a following letter, such as "220," refers to any or all of the elements in the figures bearing that reference numeral (e.g. "camera 220" in the text refers to reference numerals "camera 220A" and/or "camera 220B" in the figures).

Embodiments relate to determining display characteristics of a display panel by capturing images through multiple filters where the multiple filters include at least two filters that collectively replicate a color matching function. At least two filters of the multiple filters have transmission profiles that correspond to the same color matching function ($\bar{x}$ color matching function) in different wavelength ranges. For example, the color matching function may be the $\bar{x}(\lambda)$ standard observer color matching function as created by the International Commission on Illumination (CIE). Image capturing devices capture the display panel through respective filters and generate images. In the captured images, each pixel has a location value which is processed to determine the display characteristics (e.g., X, Y, Z tristimulus values) of a location of the display panel.

A location value, as described herein, refers to a value correlated with the brightness at a location of a display panel, as attenuated by one or more optical elements between a sensor of an image capturing device and the display panel. The one more optical elements include a corresponding filter.

A location, as described herein, refers to a single pixel or a set of adjacent pixels in the display panel.

Example Display Panel

FIG. 1 is a diagram depicting an example of a pixel scheme on a display panel 110, in accordance with an embodiment. The display panel 110 includes red subpixels 102, green subpixels 104, and blue subpixels 106. Examples of display panels 110 include an organic light emitting diode (OLED), liquid crystal display (LCD), transparent OLED (TOLED), an active-matrix organic light-emitting diode display (AMOLED), and quantum dot display. Unless specified, a display panel 110, as used hereafter, refers to either a target display panel (e.g., a display panel that is to be characterized) or a reference display panel 110B (e.g., a display panel that is used to calibrate the sensors of the system).

A pixel 115 may, for example, include two red subpixels 102 and two green subpixels 104 that are situated around a center blue subpixel 106. Other examples of pixel schemes on a display panel 110 may include differently arranged red, green, and blue (RGB) subpixels. Additionally, pixel schemes on a display panel 110 may replace or add subpixels to the RGBG subpixels depicted in FIG. 1. Examples of subpixel arrays include PENTILE® RGBG, PENTILE® RGBW, or any other suitable arrangement of subpixels that renders images at the subpixel level.

Each subpixel of the display panel 110 emits light of a certain color (e.g., red, green, and blue). The display panel 110 lights up one or more subpixels at any given time. For example, the display panel 110 may receive an input specifying that all subpixels in a pixel 115 unit cell are to be turned on. Of note, in this scenario, there may be spectral overlap between the differently colored light emitted from differently colored subpixels. In other scenarios, the display panel 110 receives an input that specifies that an individual subpixel (e.g., one red subpixel, one green subpixel) is to be turned on at a given time or alternatively, more than one pixel 115 is to be turned on at a given time. Therefore, at any particular time, the multi-camera filter system can characterize a location of the display panel 110, the location of the display panel 110 corresponding to the one or more pixels 115 (or individual subpixels) that are turned on at that particular time.

Example System for Characterizing Target Display Panel

Figure 2:
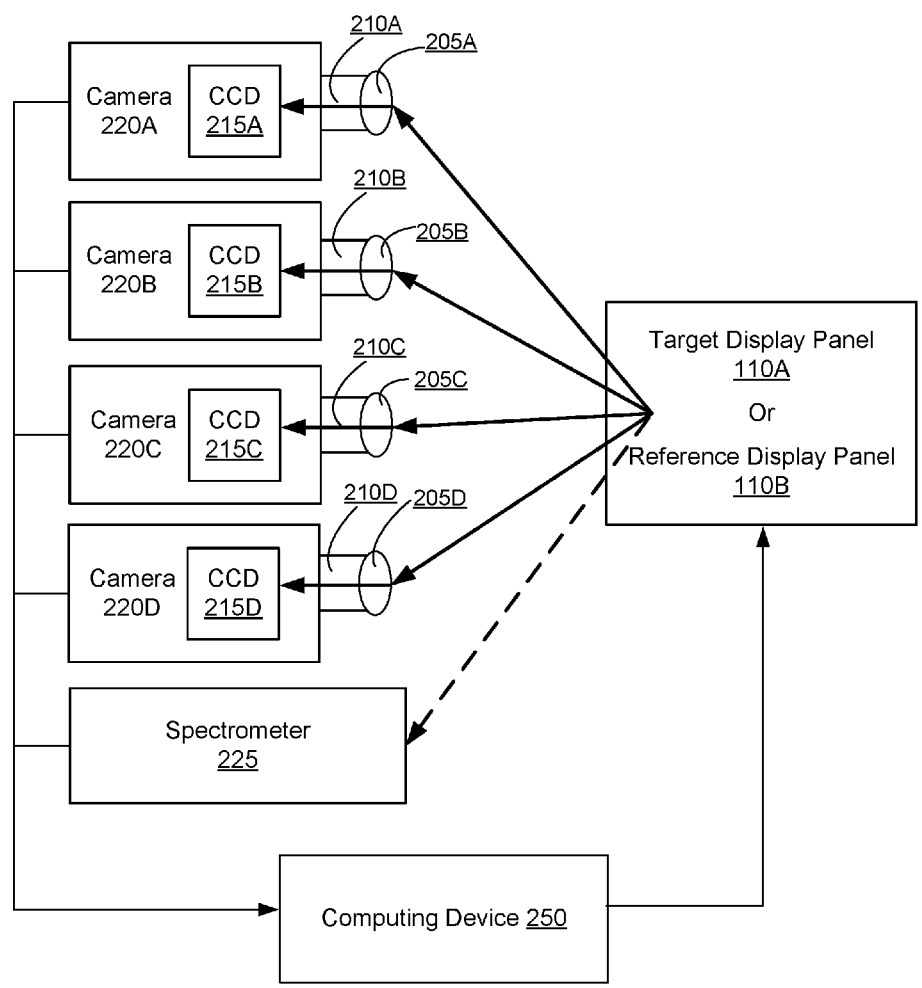
FIG. 2 is a block diagram of a system for determining characteristics of a display panel, in accordance with an embodiment.

FIG. 2 is a block diagram of a system 200 for determining characteristics of a target display panel 110A, in accordance with an embodiment. The system 200 may include, among other components, optical elements 205, filters 210, cameras 220, a spectrometer 225, and a computing device 250. As depicted in FIG. 2, the system 200 includes four optical elements 205, each optical element 205 passing light to a corresponding filter 210, and each filter 210 passing light to a corresponding camera 220. In other embodiments, the system 200 may include more than four of each of the camera 220, optical element 205, and filter 210. Namely, if the system 200 includes N total cameras 220, then the system 200 includes N optical elements 205 that each pass light to one of N filters 210 that correspond to each of the N total cameras 220.

As previously described, a display panel 110 includes pixels 115 that are composed of individual subpixels. When turned on, each individual subpixel emits a colored light (e.g., red light, green light, blue light, etc.) that is received by at an optical element 205, passed through a filter 210, and captured by a sensor of a camera 220, such as CCD 215. In various embodiments, the optical element 205 and the corresponding filter 210 may each be included as a part of the camera 220A. For example, the camera 220 may have a camera body that houses the CCD 215. Additionally, a portion of the camera facing the display panel 110 may be configured to physically couple with a filter 210 and the optical element 205.

When the one or more pixels 115 of a display panel 110 are turned on, the light emitted by the one or more pixels 115 is received by the optical elements 205. Each optical element 205 directs the received light to a corresponding filter 210. More specifically, as depicted in FIG. 2, each optical element 205 is positioned proximal to the display panel 110 relative to the corresponding filter 210 and the camera 220. An optical element 205 may be an aperture, a Fresnel lens, a convex lens, a concave lens, or any other suitable optical element that affects the image light emitted from the display panel 110. In some embodiments, each optical element 205 may have one or more coatings, such as anti-reflective coatings, that enable the optical element 205 to direct the light to the corresponding filter 210.

In various embodiments, each optical element 205 is further designed to correct one or more types of optical error. Optical error may arise due to the location of the optical element 205 relative to the display panel 110 (e.g., located above the center of the display panel versus located at the periphery of the display panel). Examples of optical error include: two dimensional optical errors, three dimensional optical errors, or some combination thereof. Two dimensional errors are optical aberrations that occur in two dimensions. Example types of two dimensional errors include: barrel distortion, pincushion distortion, longitudinal chromatic aberration, transverse chromatic aberration, or any other type of two-dimensional optical error. Three dimensional errors are optical errors that occur in three dimensions. Example types of three dimensional errors include spherical aberration, comatic aberration, field curvature, astigmatism, or any other type of three-dimensional optical error.

A filter 210 is an optical element that receives light and passes a portion of the light according to its transmission profile. In various embodiments, each filter 210 is positioned between a corresponding optical element 205 and a corresponding camera 220. The transmission profile defines the degree of attenuation of light as it is transmitted through the filter as a function of its wavelength. The degree of attenuation is dependent on the wavelength of the received light as well as the angle of incidence of the received light. Therefore, depending on the transmission profile, a filter 210 may pass more percentage of the light at one wavelength compared to the light at another wavelength. In various embodiments, each filter 210 has a transmission profile that matches a color matching function across at least a sub-band of light frequency, as described below in detail with reference to FIG. 4.

The computing device 250 is hardware, software, firmware or a combination thereof for determining characteristics of a display panel based on the images received from the cameras 220. For this purpose, the computing device 250 communicates with other components of the system 200 including the cameras 220 and the spectrometer 225. Additionally, the computing device 250 may communicate with the display panel 110. For example, from each camera 220, the computing device 250 receives images generated by a CCD 215 of the camera 220. Pixels in the images describe the intensity of photons of light received at different pixels of CCD 215 in the camera 220. From the spectrometer 225, the computing device 250 receives the true spectrum of light that was captured from the reference display panel 110B. Using these inputs, the computing device 250 calibrates the CCD 215 of the system 220 by determining a color correction matrix (CCM). Subsequently, the computing device 250 determines the characteristics (e.g., tristimulus values) of the turned on one or more pixel 115 units of a target display panel 110A by applying the CCM. The computing device 250 is discussed further below in reference to FIG. 5A and FIG. 5B.

A camera 220 is an image capturing device that captures and generates an image. In various embodiments, the camera may employ a sensor such as CCD 215 to capture the image. The CCDs 215 of the camera 220 captures an image of the display panel 110. The CCD 215 may have an array of pixels (e.g., 1024×768 or 640×480) such that each pixel of the CCD 215 captures a signal intensity (e.g., photon flux) corresponding to a location of the display panel 110. A CCD 215 may capture light from multiple locations of the display panel 110 on its array of pixels and generates a series of signals from its pixels. Each signal intensity corresponding to a particular location of the display panel 110 is referred to herein as "a location value." In one embodiment, the location value is a voltage signal generated by a Metal-Oxide-Semiconductor (MOS) capacitor in a pixel of the CCD 215, which changes based on the photons incident upon the capacitor. Therefore, the CCD 215 in the camera 220 captures location values that correspond to different locations of the display panel 110 of one or more pixels 115. The location values generated by CCD 215 are provided to the computing device 250 for processing, as described below in detail with reference to FIG. 5B.

The spectrometer 225 is a device that generates true spectrum of light. The spectrometer 225 may be embodied as, but not limited to, a spectrophotometer, a colorimeter, or a spectroradiometer. The spectrometer 225 determines a spectrum of light, hereafter referred to as a true spectrum of light, that measures the intensities of light photons across the full range of wavelengths originating from a pixel 115 or a set of pixels on a reference display panel 110B. Specifically, as differentiated by the dotted line in FIG. 2, the spectrometer 225 of the system 200 is used to capture a true spectrum of light from a reference display panel 110B and may not be used to capture spectrum components of light from the target display panel 110A. The true spectrum of light from a reference display panel 110B detected by the spectrometer 225 is provided to the computing device 250 to calibrate CCDs 215 of each camera 220, such that the characterization of a target display panel 110A can occur without further employment of the spectrometer 225.

Figure 3:
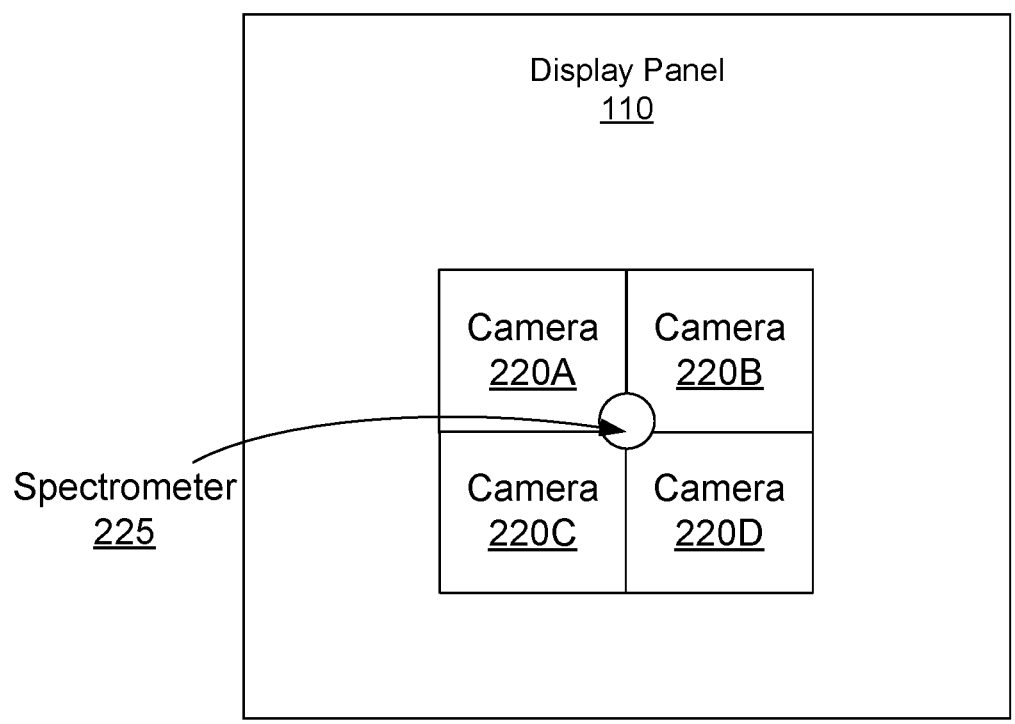
FIG. 3 is a schematic diagram illustrating an arrangement of cameras and a spectrometer relative to a display panel, in accordance with one embodiment.

FIG. 3 is a schematic diagram illustrating an arrangement of cameras 220 and a spectrometer 225 relative to a display panel 110, in accordance with one embodiment. For example, each camera 220 may be placed above the display panel 110 to capture the light emitted by the turned on one or more pixels 115 of the display panel 110. As specifically depicted in FIG. 3, the cameras 220 are arranged in a 2×2 array above a pre-determined location (e.g., center) of the display panel 110. Such placement of the cameras 220 in proximity to one another can minimize image deviations that can arise due to varied environmental conditions (e.g., temperatures, physical vibrations) that change based on locations.

In the embodiment of FIG. 3, the spectrometer 225 is located above the display panel 110 in proximity to the 2×2 array of cameras 220. In other embodiments, the cameras 220 and spectrometer 225 need not be placed specifically over the center of the display panel 110 and can be placed at different locations above the display panel 110.

Example Filter Transmission Profile

Figure 4:
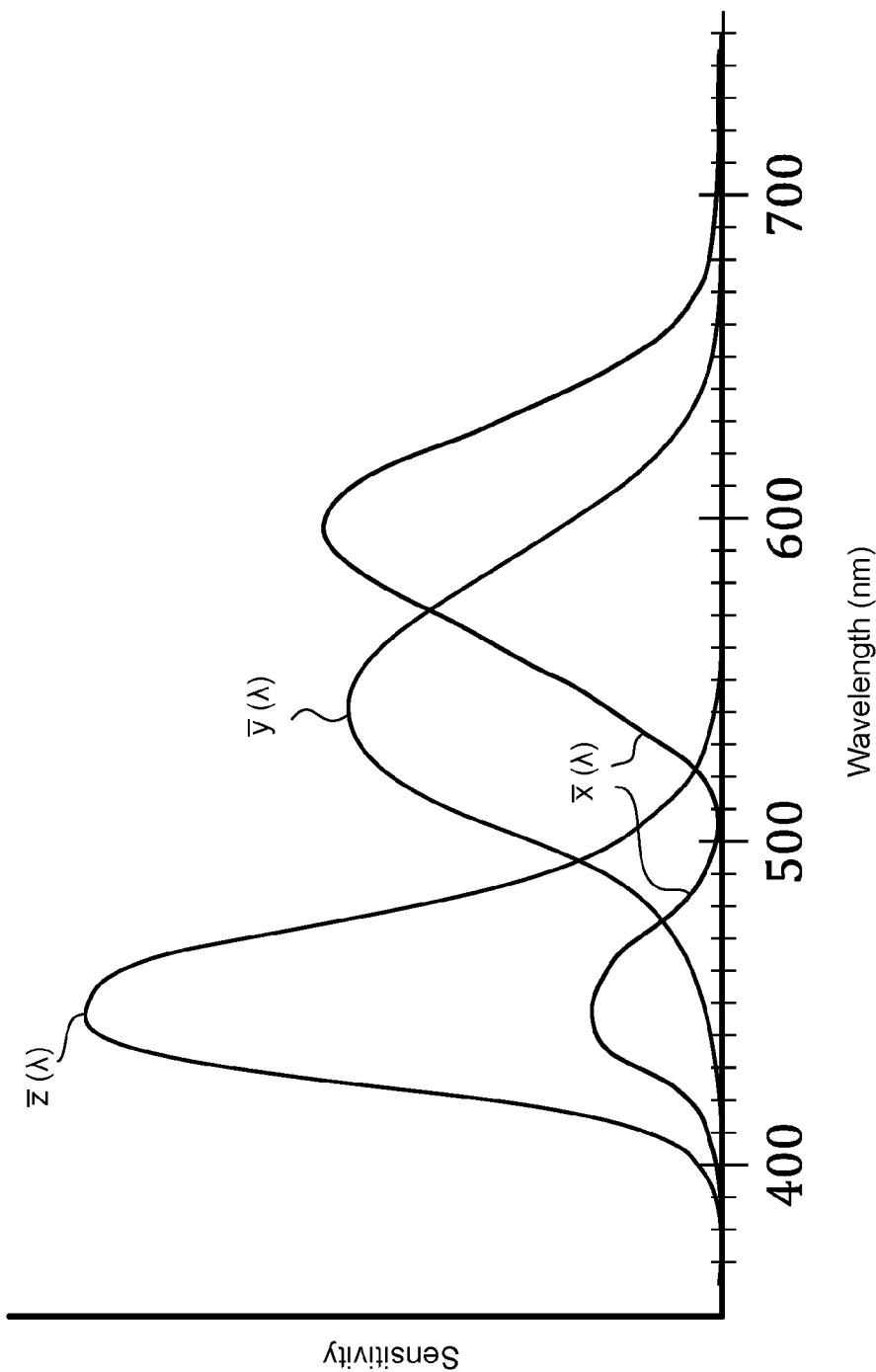
FIG. 4 is a graph illustrating color matching functions, in accordance with one embodiment.

FIG. 4 is a graph illustrating three different color matching functions, in accordance with one embodiment. More specifically, FIG. 4 illustrates the three standard observer color matching functions ($\bar{x}(\lambda)$, $\bar{y}(\lambda)$, and $\bar{z}(\lambda)$) as created by the International Commission on Illumination (CIE).

As depicted by FIG. 4, the $\bar{x}(\lambda)$ color matching function has two discrete hills, one between a first range between 400 nm and 500 nm with a sensitivity peak at approximately 440 nm, and a second range between 500 nm and 700 nm with a second sensitivity peak at approximately 600 nm. The $\bar{y}(\lambda)$ and the $\bar{z}(\lambda)$ color matching functions each have a single sensitivity peak at approximately 555 nm and 445 nm, respectively.

A first filter 210A may have a transmittance profile that filters light in a first range of wavelengths (i.e., 400-500 nm) while blocking light having wavelengths beyond the first range in a way that the filtered light corresponds to (or matches) the $\bar{x}(\lambda)$ color matching function in the first range. A second filter 210B may have a transmittance profile that filters light in a second range of wavelengths (e.g., 500-700 nm) while blocking light having wavelengths beyond the second range in a way that the light filtered by the second filter 210B corresponds to (or matches) the $\bar{x}(\lambda)$ color matching function in the second range. Similarly, the third filter 210C and fourth filter 210D can each have a transmittance profile that filters light in a manner so that the filtered light corresponds to the $\bar{y}(\lambda)$ color matching function and the $\bar{z}(\lambda)$ color matching function, respectively. Each filter may be constructed, for example, using interference filter technology.

As described herein, the recited wavelength ranges are merely used for example purposes and do not limit how each filter 210 is configured. The filters 210 may be configured to correspond to wavelength ranges of color matching functions other than the CIE standard observer color matching functions (e.g., $\bar{x}(\lambda)$, $\bar{y}(\lambda)$, and $\bar{z}(\lambda)$). For example, given that the CIE standard observer color matching functions are one particular linear transformation of the CIE RGB color matching functions, the filters 210 may each be configured to correspond to color matching functions that are different linear transformations of the CIE RGB color matching functions.

Example Computing Device for Characterizing a Display Panel

Figure 5A:
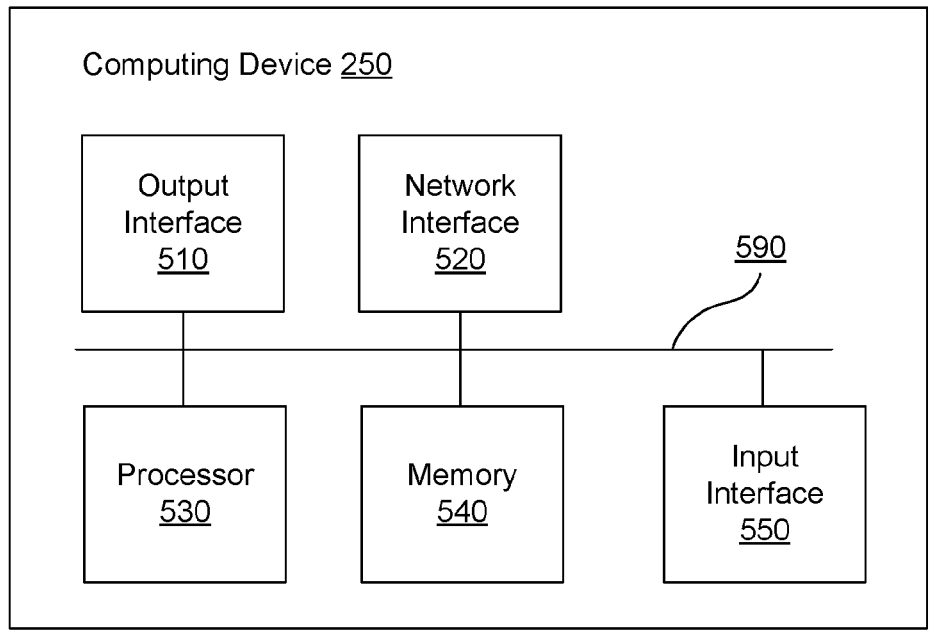
FIG. 5A is an example computing device in the system for characterizing a display panel, in accordance with one embodiment.

FIG. 5A is a block diagram of an example computing device 250 in the system 200 for characterizing a target display panel 110A, in accordance with one embodiment. The computing device 250 may include, for example, components such as an output interface 510, a network interface 520, a processor 530, a memory 540, an input interface 550, and a bus 590 connecting each of these components.

The input interface 550 is hardware, software, firmware or a combination thereof for receiving input from a user. The input interface 550 may be embodied as a touch-screen interface, mouse, track ball, or other type of pointing device, a keyboard, an auditory input device, or some combination thereof, and is used to input data into the computing device 250. In some embodiments, the computing device 250 may be configured to receive input (e.g., commands) from the input interface 550 from the user. As an example, the input interface 550 may receive an input into the computing device 250 specifying starting or ending of the process for determining the characteristics of the display panel.

The output interface 510 is a component for providing the computation results in various forms (e.g., text, image, or audio signals). For example, the output interface 510 may be a display that depicts the results (e.g., determined tristimulus values) of turned on pixels 115 of a target display panel 110A. The network interface 520 enables the computing device 250 to communicate with other components of the system 200 including the cameras 220, and spectrometer 225. The network interface 520 may further enable the computing device 250 to communicate with the display panel 110 and other computing devices 250 through a network.

The processor 530 retrieves and executes commands stored in memory 540. Although a single processor 530 is illustrated in FIG. 5A, multiple processors may be provided in the computing device 250.

Figure 5B:
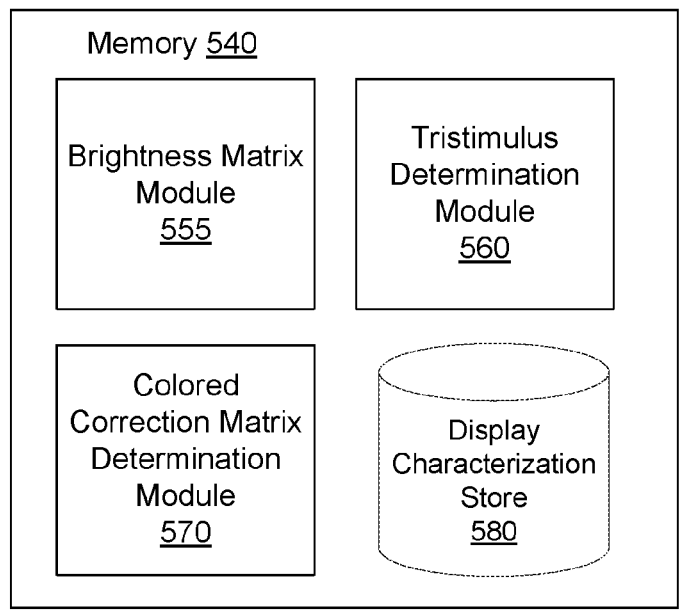
FIG. 5B is a block diagram of a memory included in the example computing device of the system, in accordance with one embodiment.

FIG. 5B is a block diagram of the memory 540 included in the example computing device 250 of the system 200, in accordance with one embodiment. The memory 540 may include software components, such as a brightness matrix module 555, tristimulus determination module 560, and CCM determination module 570, and display characterization store 580.

Each software component is used to characterize a location of a target display panel 110A. For example, the brightness matrix module 555 generates a brightness matrix that is constructed using location values received from each CCD 215. The CCM determination module 570 determines a CCM using the true spectrum of light generated by the spectrometer 225. The tristimulus determination module 560 characterizes a location of a target display panel 110A (e.g., determines the tristimulus values) using the brightness matrix and the determined CCM. Each element for characterizing a location of a target display panel 110A is described further below.

Determining Tristimulus Values of a Display Panel

To determine the tristimulus values of a location on a target display panel, the software modules stored in the memory 540 of the computing device 250 are configured to calculate a CCM and a brightness matrix. Namely, XYZ tristimulus values can be calculated by Equation (1) as:

$$\begin{bmatrix} X \\ Y \\ Z \end{bmatrix} = \begin{bmatrix} a_{11} & a_{12} & a_{13} \\ a_{21} & a_{22} & a_{23} \\ a_{31} & a_{32} & a_{33} \end{bmatrix} * \begin{bmatrix} S'(x) \\ S'(y) \\ S'(z) \end{bmatrix} \quad (1)$$

where $$\begin{bmatrix} a_{11} & a_{12} & a_{13} \\ a_{21} & a_{22} & a_{23} \\ a_{31} & a_{32} & a_{33} \end{bmatrix}$$

is an N× N CCM (in this case, N=3) and $$\begin{bmatrix} S'(x) \\ S'(y) \\ S'(z) \end{bmatrix}$$

is the brightness matrix. In other embodiments, the CCM may have dimensionality that is greater than N=3. For example, if the system 200 includes six different cameras 220 and subsequently generates a brightness matrix with six different updated location values (e.g., S'(x), S'(y), etc.) that correspond to the six different CCDs 215, then the CCM may be constructed with a 6×6 dimensionality.

The brightness matrix module 555 is responsible for generating the brightness matrix to be used in determining the XYZ tristimulus values. More specifically, the brightness matrix module 555 receives and processes images received from the cameras 220A through 220D where each image includes a pixel that is one of a location value $S(x_1)$, a location value $S(x_2)$, a location value S(y), or a location value S(z) of a certain location of a reference display panel 110B or a target display panel 110A.

The brightness matrix module 555 updates location values ($S(x_1)$, $S(x_2)$, S(y) and S(z)) to account for any attenuation of brightness that may have occurred within the system 200. In other words, the brightness matrix module 555 updates the image received from the CCDs 215 by updating the location values ($S(x_1)$, $S(x_2)$, S(y) and S(z)) to account for loss that may have occurred during transmission of the light. As one example, the brightness matrix module 555 accounts for the quantum efficiency of the CCD 215 that captured the location value. If the first CCD 215A has an average quantum efficiency of 80% for the range of wavelengths (e.g., 400-500 nm), then the location values received from the first CCD 215A is divided by 0.8. As another example, the brightness matrix module 555 updates the location values to account for the optical transmittance of the corresponding optical element 205 that may have attenuated the detected signal intensity. As another example, the brightness matrix module 555 updates the location values to account for the transmission profile (e.g., angle of incidence) of the corresponding filter 210. In this way, $S(x_1)$, $S(x_2)$, S(y) and S(z) for each location are updated to $S'(x_1)$, $S'(x_2)$, S'(y) and S'(z), respectively.

After obtaining the updated location values $S'(x_1)$, $S'(x_2)$, S'(y) and S'(z), the brightness matrix module 555 combines some of the updated location values. More specifically, the brightness matrix module 555 combines updated location values corresponding to the same color matching function. For example, as previously described, the first CCD 215A captures an image via a first filter 205A with a transmittance profile (e.g., 400-500 nm) that matches the $\bar{x}(\lambda)$ color matching function in the first range whereas the second CCD 215B captures an image via a second filter 205B with a transmittance profile (e.g., 500-700 nm) that matches the same $\bar{x}(\lambda)$ color matching function in the second range. Therefore, the brightness matrix module 555 combines the updated location values from the first CCD 215A and second CCD 25B in order to obtain a combined location value that corresponds to the full wavelength spectrum of the $\bar{x}(\lambda)$ color matching function. The combined location value S'(x) is expressed in Equation (2) as:

$$S'(x)=S'(x_1)+S'(x_2) \quad (2)$$

In various embodiments, the brightness matrix module 555 maintains the updated location values from the third CCD 215C (e.g., S'(y)) and fourth CCD 215D (e.g., S'(z)). As such, the brightness matrix module 555 generates the brightness matrix $$\begin{bmatrix} S'(x) \\ S'(y) \\ S'(z) \end{bmatrix}$$

that can be used to determine the tristimulus values of the one or more turned on pixels 115 of the target display panel 110A.

The tristimulus determination module 560 determines the tristimulus values for different locations of display panels. In one embodiment, when determining the tristimulus values of a reference display panel 110B, the tristimulus determination module 560 receives the true spectrum of the reference display panel 110B from the spectrometer 225 and then calculates the XYZ tristimulus values using the following equations:

$$X = \int_{380}^{780} L(\lambda) * \bar{x}(\lambda) d\lambda, \quad (3)$$

$$Y = \int_{380}^{780} L(\lambda) * \bar{y}(\lambda) d\lambda, \text{ and} \quad (4)$$

$$Z = \int_{380}^{780} L(\lambda) * \bar{z}(\lambda) d\lambda. \quad (5)$$

Thus, the calculated XYZ tristimulus values corresponding to a location of a reference display panel 110B are provided to the CCM determination module 570 for further calibration.

For a target display panel 110A, the tristimulus determination module 560 receives the brightness matrix generated by the brightness matrix module 555 that includes the updated location values of the target display panel 110A and uses CCM previously calculated by the CCM determination module 570 to obtain XYZ stimulus values for various locations of the target display panel 110A. More specifically, the tristimulus determination module 560 can determine the tristimulus values of the one or more turned on pixels 115 of a target display panel 110A using Equation (1).

The tristimulus determination module 560 stores the determined tristimulus values of the one or more turned on pixels 115 in the display characterization store 580. Additionally, the determined tristimulus values may be presented on the output interface 510 of the computing device 250 such that a user of the computing device 250 can appropriately evaluate the display characteristics (e.g., luminance, chromaticity) of the one or more turned on pixels 115 of the target display panel 110A. In another embodiment, the determined tristimulus values are compared to a range of appropriate tristimulus values and the output interface 510 displays an indication as to whether the display characteristics of the one or more turned on pixels 115 are within the range of appropriate tristimulus values.

Determining Color Correction Matrix

The CCM determination module 570 calibrates the CCDs 215 of the system 200 by determining a CCM that is used for calculating the tristimulus values of locations on a target display panel 110A. To do so, the CCM determination module 570 first calculates a CCM based on the images of the reference display panel 110B captured by cameras 220. For example, the CCM determination module 570 receives, from the tristimulus determination module 560, the tristimulus values of a location (e.g., one or more turned on pixels 115) from a reference display panel 110B calculated according to equations (3), (4), and (5). Additionally, the CCM determination module 570 receives, from the brightness matrix module 555, a brightness matrix including location values of the reference display panel 110B. Therefore, with the tristimulus values of the reference display panel 110B and the brightness matrix corresponding to the reference display panel 110B, the CCM determination module 570 can calculate a CCM using Equation (1). The CCM determined by the CCM determination module 570 is provided to the tristimulus determination module 560 for determining the tristimulus values of a target display panel 110B.

In various embodiments, the CCM determination module 570 determines a CCM only once using the images representing a reference display panel 110B (e.g., a true spectrum from the spectrometer 225). The CCM determination module 570 can provide the same CCM to the tristimulus determination module 560 for determining the tristimulus values at different locations of target display panels 110B.

In various embodiments, the CCM determination module 570 may reevaluate and update a CCM at pre-determined intervals. For example, the CCM determination module 570 may recalculate a CCM after the system 200 has characterized a threshold number of target display panels 110A. Alternatively, the CCM determination module 570 may recalculate a CCM after a pre-determined duration (e.g., 30 minutes, 1 hour) to ensure that the system 200 remains calibrated.

Example Process for Characterizing Pixels of a Display Panel

FIG. 6 is a flowchart illustrating a process for determining characteristics of a target display panel 110A, in accordance with one embodiment. The system 200 generates 605 a CCM using a reference display panel 110B. For example, the computing device 250 generates the CCM using location values received from the CCDs 215 and the true spectrum received from the spectrometer 225. More specifically, the CCM determination module 570 calculates a CCM according to Equation (1).

The system 200 turns on 610 the one or more pixels 115 of the target display panel 110A that are to be characterized. The cameras 220 of the system 200 each capture images of the target display panel 110A via a corresponding filter 210. In various embodiments, each filter 210 is configured with a transmission profile that matches at least a portion of a color matching function. For example, a first camera 220A captures 620 an image via first filter 210A that is configured with a transmittance profile that matches a range of wavelengths of the $\bar{x}$ color matching function and a second camera 220B captures 625 an image via second filter 210B that is configured with a transmittance profile that matches a second range of wavelengths of the $\bar{x}$ color matching function, the second range being higher than the first range of wavelengths.

For each captured image, the computing device 250 of the system 200 updates 630 the captured image to take into account a quantum efficiency of a sensor (e.g., CCD 215) that captured each image. Additionally, the computing device 250 may further update the captured image by taking into account the optical transmittance of one or more optical elements 205 that may have attenuated the signal intensity of the captured image.

The computing device 250 of the system 200 determines 635 the tristimulus values corresponding to the turned on one or more pixels 115 of the target reference panel 110B using updated location values that each indicates a signal intensity (e.g., brightness) of the one or more turned on pixels 115. For example, the computing device 250 generates a brightness matrix that includes a combined location value representing the location values from a first CCD 215A and the second CCD 215B. Additionally, the computing device 250 receives the CCM previously generated using measurements from the reference display panel 110B. As such, the computing device 250 determines the tristimulus values using Equation (1).

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

What is claimed is:

1. A system for determining characteristics of a target display panel, the system comprising:
 a plurality of filters including a first filter and a second filter, the first filter having a transmittance profile that matches a color matching function in a first wavelength range, the second filter having a transmittance profile that matches the color matching function in a second wavelength range higher than the first wavelength range;
 a plurality of image capturing devices including a first camera capturing a first image of a display panel via the first filter and a second camera capturing a second image of the display panel via the second filter; and
 a computing device operatively coupled to the plurality of image capturing devices to receive captured images including the first image and the second image from the plurality of image capturing devices, the computing device configured to determine at least one of tristimulus values for a location in the target display panel by at least:

updating the first image to take into account at least a quantum efficiency of a sensor in the first image capturing device;

updating the second image to take into account a quantum efficiency of a sensor in the second image capturing device; and adding a location value correlated with a brightness of the location as indicated in the updated first image and a location value correlated with a brightness of the location as indicated in the updated second image.

2. The system of claim 1, wherein the computing device is configured to determine one of the tristimulus values by multiplying a brightness matrix and a color correction matrix, the brightness matrix including the added location value as an element.

3. The system of claim 2, wherein the color correction matrix is obtained by comparing spectra of light at one or more locations of a reference display panel and corresponding brightness matrices derived from images of the reference display panel captured by the image capturing devices via filters including the first and second filters.

4. The system of claim 2, wherein the brightness matrix further includes location values derived from images of the target display panel other than the first image and the second image as elements.

5. The system of claim 4, wherein the location values derived from images of the target display panel other than the first image and the second image include at least two additional location values, each additional location value previously captured by an additional camera included in the system.

6. The system of claim 1, wherein an optical transmittance of a lens in the first image capturing device is taken into account in the updated first image, and an optical transmittance of a lens in the second image capturing device is taken into account in the updated second image.

7. The system of claim 1, wherein the plurality of filters further includes a third filter having a transmittance profile that matches a second color matching function in a corresponding wavelength range, and a fourth filter having a transmittance profile that matches a third color matching function in a corresponding wavelength range, the third and fourth filters each providing an image of the target display panel to a third and fourth camera, respectively, included in the plurality of image capturing devices.

8. The system of claim 1, wherein the color matching function is one of a red color matching function or a linear transformation of the red color matching function.

9. The system of claim 1, wherein the first wavelength range includes 440 nm and the second wavelength range includes 600 nm.

10. The system of claim 1, wherein the location in the target display panel corresponds to one or more turned on pixels on the target display panel.

11. A method for determining characteristics of a target display panel by a system, the method comprising:

turning on one or more pixels corresponding to a location in a target display panel;

capturing, by a first image capturing device of the system, a first image corresponding to the turned on one or more pixels that is passed through a first filter configured with a transmittance profile that matches a color matching function in a first wavelength range;

capturing, by a second image capturing device of the system, a second image corresponding to the turned on one or more pixels that is passed through a second filter configured with a transmittance profile that matches the color matching function in a second wavelength range that is higher than the first wavelength range;

updating the first captured image to take into account at least a quantum efficiency of a sensor in the first image capturing device and the second captured image to take into account least a quantum efficiency of a sensor in the second image capturing device;

determining at least one of tristimulus values for the location of the target display panel by generating a combined location value, the combined location value generated by combining a location value correlated with a brightness of the location as indicated in the updated first image and a location value correlated with a brightness of the location as indicated in the updated second image; and multiplying a color correction matrix and a brightness matrix that includes the combined location value as an element.

12. The method of claim 11, wherein the color correction matrix is obtained by comparing spectra of light at one or more locations of a reference display panel and corresponding brightness matrices derived from images of the reference display panel captured by the first and second image capturing devices via the first and second filters, respectively.

13. The method of claim 11, wherein the brightness matrix further includes location values derived from images of the target display panel other than the first image and the second image as elements.

14. The method of claim 13, wherein the location values derived from images of the target display panel other than the first image and the second image include at least two additional location values, each additional location value previously captured by an additional camera included in the system.

15. The method of claim 11, wherein updating the first captured image further takes into account an optical transmittance of a lens in the first image capturing device, and wherein updating the second captured image further takes into account an optical transmittance of a lens in the second image capturing device.

16. The method of claim 11, wherein the color matching function is one of a red color matching function or a linear transformation of the red color matching function.

17. The method of claim 11, wherein the first wavelength range includes 440 nm and the second wavelength range includes 600 nm.

18. The method of claim 11, wherein the sensor of the first image capturing device and the sensor of the second image capturing device are each charge-coupled devices that quantify a signal intensity of a captured image.

* * * * *